US010254126B2

(12) United States Patent
Coutelou et al.

(10) Patent No.: US 10,254,126 B2
(45) Date of Patent: Apr. 9, 2019

(54) SYSTEM FOR CALCULATING AN ELECTRIC QUANTITY, TRANSFORMER SUB-STATION COMPRISING SUCH A SYSTEM AND METHOD FOR CALCULATING AN ELECTRIC QUANTITY WITH SUCH A SYSTEM

(71) Applicant: Schneider Electric Industries SAS, Rueil-Malmaison (FR)

(72) Inventors: Olivier Coutelou, Grenoble (FR); Damien Sillans, Lans En Vercors (FR); Maxime Gaillard, Gieres (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 605 days.

(21) Appl. No.: 14/301,517

(22) Filed: Jun. 11, 2014

(65) Prior Publication Data
US 2014/0368351 A1 Dec. 18, 2014

(30) Foreign Application Priority Data
Jun. 17, 2013 (FR) .................................. 13 55657

(51) Int. Cl.
G01D 4/00 (2006.01)
G01R 19/25 (2006.01)
H02J 13/00 (2006.01)

(52) U.S. Cl.
CPC ......... G01D 4/002 (2013.01); G01R 19/2513 (2013.01); H02J 13/0079 (2013.01)

(58) Field of Classification Search
CPC .. G01R 21/06; G01R 22/063; G01R 19/2513; H01F 38/38; G01D 4/002; H02J 13/0079
(Continued)

(56) References Cited

U.S. PATENT DOCUMENTS 4,672,555 A * 6/1987 Hart ...................... G01R 19/25
324/142
5,325,048 A * 6/1994 Longini ................. G01R 35/04
324/130
(Continued)

FOREIGN PATENT DOCUMENTS

AU 2012292042 A1 2/2014
CN 102043115 A 5/2011
(Continued)

OTHER PUBLICATIONS

Schimid et al., Meter Any Wire, Anywhere by Virtualizing the Voltage Channel, Nov. 2010, BuildSys' 10.*
(Continued)

*Primary Examiner* — Muhammad N Edun
*Assistant Examiner* — Jerold Murphy
(74) *Attorney, Agent, or Firm* — Oblon, McClelland, Maier & Neustadt, L.L.P.

(57) ABSTRACT

The system (20) according to the invention for calculating an electric quantity relative to an electrical installation comprising several secondary electrical conductors (42A, . . . , 48C) electrically connected to a primary electrical conductor (34; 36; 38). This system comprises a first module (60) including a wireless transmitter (70) and a plurality of second modules (62A, 62B, 62C). Each second module includes first means (84A, 88A; 84B, 88B; 84C, 88C) for receiving a first synchronization message (M1) and second transmission means (84A, . . . , 88C) for sending a second message (M2A, M2B, M2C) containing at least one intensity value measured by the corresponding current sensor to a third module (63). The intensity values are measured quasi-simultaneously and the third module includes a unit (104) for calculating the electric quantity from intensity values received via said second messages.

18 Claims, 9 Drawing Sheets

Figure 1:
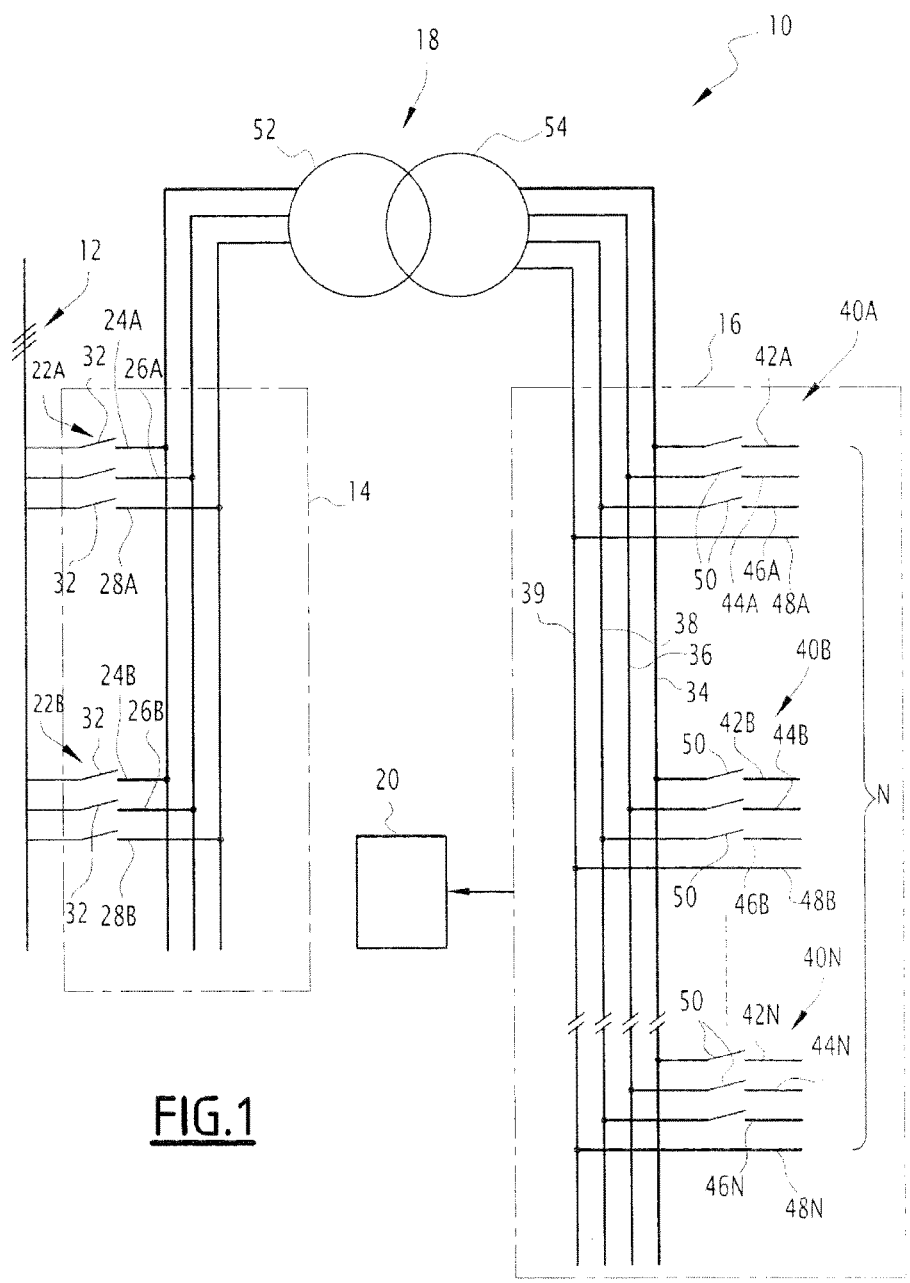

(58) Field of Classification Search
USPC .......................... 340/870.05; 324/76.11–157
See application file for complete search history.

(56) References Cited

U.S. PATENT DOCUMENTS

| | | | |
|---|---|---|---|
| 5,517,106 A | 5/1996 | Longini | |
| 5,805,395 A | 9/1998 | Hu et al. | |
| 5,995,911 A | 11/1999 | Hart | |
| 6,236,949 B1 | 5/2001 | Hart | |
| 8,014,964 B1 | 9/2011 | Khalsa | |
| 8,768,341 B2 | 7/2014 | Coutelou et al. | |
| 9,696,354 B2* | 7/2017 | Coutelou | G01R 21/06 |
| 2004/0233852 A1* | 11/2004 | Ochi | H04H 60/04 |
| | | | 370/242 |
| 2008/0147335 A1* | 6/2008 | Adest | G01D 4/004 |
| | | | 702/64 |
| 2010/0179779 A1 | 7/2010 | Taft | |
| 2010/2834340 | 11/2010 | Kakiuchi | |
| 2011/0010118 A1 | 1/2011 | Gaarder | |
| 2012/0089356 A1 | 4/2012 | Taft | |
| 2013/0211751 A1* | 8/2013 | Park | G01R 21/06 |
| | | | 702/61 |
| 2014/0091782 A1* | 4/2014 | Sykes | G01R 15/22 |
| | | | 324/76.11 |
| 2014/0208130 A1* | 7/2014 | Morales | G06F 1/30 |
| | | | 713/300 |
| 2014/0239941 A1 | 8/2014 | Coutelou et al. | |

FOREIGN PATENT DOCUMENTS

| | | |
|---|---|---|
| CN | 202649306 U | 1/2013 |
| CN | 102937675 A | 2/2013 |
| EP | 2 549 280 A1 | 1/2013 |
| EP | 2685267 A1 | 1/2014 |
| GB | 2 452 989 A | 3/2009 |
| WO | WO 2009/140777 A1 | 11/2009 |
| WO | WO 2010/083164 A2 | 7/2010 |
| WO | WO 2013/017663 A1 | 2/2013 |

OTHER PUBLICATIONS

U.S. Appl. No. 14/541,347, filed Nov. 14, 2014, Coutelou, et al.
French Preliminary Search Report dated May 9, 2014 in French Application 13 55657, filed on Jun. 17, 2013 ( with English Translation of Categories of Cited Documents).
Combined Chinese Office Action and Search Report dated Jan. 3. 2018 in Chinese Patent Application No. 201410269769.3 (with English translation), 28 pages.

* cited by examiner

SYSTEM FOR CALCULATING AN ELECTRIC QUANTITY, TRANSFORMER SUB-STATION COMPRISING SUCH A SYSTEM AND METHOD FOR CALCULATING AN ELECTRIC QUANTITY WITH SUCH A SYSTEM

The present invention relates to a system for calculating an electric quantity relative to an electrical installation comprising a primary electrical conductor and several secondary electrical conductors electrically connected to the primary electrical conductor, the calculating system comprising:
- a first module including a wireless transmitter,
- a plurality of second modules, each including a wireless transceiver and a current sensor capable of measuring the intensity of a current circulating in a corresponding conductor from among the primary and secondary electrical conductors.

The present invention also relates to a transformer substation for transforming an electric current having a first alternating voltage into an electric current having a second alternating voltage, this transformer substation comprising such a calculating system.

The present invention also relates to a method for calculating an electric quantity with such a calculating system.

A calculating system of the aforementioned type is known from document WO 2010/119332 A1. The calculating system comprises calculating modules for calculating an electric energy or electric power, a database for storing calculated energy or power values, and a management module capable of providing remote clients with information corresponding to the measured and calculated values. The calculating modules are connected by wireless links to a communication gateway, which in turn is connected to a network. The database, the management module and the remote clients are also connected to the network. Each calculating module is capable of calculating the electric energy and power of the current circulating in an electrical conductor. It includes an intensity sensor, a processing unit capable of calculating the electric energy and power, and a wireless transceiver. Each calculating module is synchronized with the communication gateway using a clock.

However, such a calculating system requires the presence of a current sensor associated with each electrical conductor for which the energy and the electric power are calculated. Furthermore, such a system is relatively complex and expensive.

The aim of the invention is therefore to propose a system for calculating an electric quantity of the intensity or electric energy or power type for an electrical conductor with which no current sensor is associated. The invention for example makes it possible, in an electrical installation comprising a primary electrical conductor and several secondary electrical conductors, to measure the electrical intensity in all of the secondary electrical conductors and to calculate the electrical intensity in the primary conductor from those measured values.

To that end, the invention relates to a calculating system of the aforementioned type, wherein:
- the first module includes transmission means for transmitting a first time synchronization message to each second module,
- each second module includes first means for receiving the first message and second means for transmitting a second message, containing at least one intensity value measured by the corresponding current sensor, to a third module, the intensity values being measured quasi-simultaneously by the various current sensors, preferably with a synchronization margin of error smaller than 10 µs.
- the calculating system comprises the third module, and the third module includes a wireless receiver, second means for receiving second messages, and a unit for calculating the electric quantity from intensity values measured quasi-simultaneously and received via said second messages.

According to advantageous aspects of the invention, the calculating system further comprises one or more of the following features, considered alone or according to all technically acceptable combinations:
- the calculating unit is capable of calculating a sum of the intensity values received via the second messages.
- the first module further comprises a unit for measuring the voltage circulating in a corresponding conductor from among the primary and secondary electrical conductors, and is able to send the value of the measured voltage to the second modules via the first message, while each second module comprises means for calculating an instantaneous power from the value of the voltage received via the first message and the intensity value measured by the current sensor, and is able to send the value of the calculated electric power to the third module via the second message, and while the calculating unit of the third module is capable of calculating a sum of the received power values.
- the first module further comprises a unit for measuring the voltage circulating in a corresponding conductor from among the primary and secondary electrical conductors, and is able to send the value of the measured voltage to the second modules via the first message, while each second module comprises means for calculating an electric energy from the value of the voltage received via the first message and the intensity value measured by the current sensor, and is able to send the value of the calculated energy value to the third module via the second messages, and while the calculating unit of the third module is capable of calculating a sum of the received energy values.
- each current sensor is capable of measuring the intensity of the corresponding current and each second module comprises a sampling unit capable of sampling the measured intensity using a sampling frequency.
- the first message contains the value of said sampling frequency, said value preferably being a predetermined value or a multiple of the value of the frequency of the voltage of at least one conductor from among the primary and secondary electrical conductors.
- the second modules comprise first compression means capable of calculating coefficients of the decomposition of said intensity value measured by the corresponding current sensor into a Fourier series.
- the samples are acquired successively over several periods of said voltage, and according to increasing values of a sampling rank during a given period, the rank value being reset at the end of each period, while the second modules comprise first compression means for the intensity values measured by the corresponding current sensor, those compression means calculating the mean of the samples having a same rank value.
- the first message contains a reception request for the intensity values measured by the second modules.

The invention also relates to a transformer substation for transforming an electric current having a first alternating voltage into an electric current having a second alternating voltage, comprising:
- a first panel including at least one incoming electrical conductor capable of being connected to an electric network,
- a second panel including at least one primary outgoing electrical conductor and several secondary outgoing electrical conductors, each secondary outgoing conductor being electrically connected to a corresponding primary outgoing conductor,
- an electric transformer connected between the first panel and the second panel and capable of transforming the current with the first alternating voltage by the current having the second alternating voltage, and
- a system for calculating an electric quantity relative to the second panel,
- wherein the calculating system is as defined above.

The invention also relates to a method for calculating an electric quantity relative to an electrical installation, the electrical installation comprising a primary electrical conductor and several secondary electrical conductors electrically connected to the primary electrical conductor, the method being implemented using a calculating system including a first module including a wireless transmitter, a plurality of second modules, each including a wireless transceiver, and a first current sensor capable of measuring the intensity of a current circulating in a corresponding conductor from among the primary and secondary electrical conductors.

According to the invention, the method comprises the following steps:
- a) the transmission, by the first module and to each second module, of a first time synchronization message of the measurement of the intensity of the current circulating in the primary or secondary conductors,
- b) reception of the first message by each second module,
- c) the quasi-simultaneous measurement, preferably with a synchronization margin of error smaller than 10 μs, of the intensity of the current circulating in the corresponding primary or secondary conductors by each current sensor,
- d) the transmission, by each second module and to a third module, of a second message containing at least one value of the intensity measured by the corresponding current sensor,
- e) the reception of the second messages by the third module,
- f) the calculation of the electric quantity from intensity values measured quasi-simultaneously and received via said second messages.

According to other advantageous aspects of the invention, the calculating method comprises one or more of the following features, considered alone or according to any technically acceptable combinations:
- during step a), the voltage of a corresponding conductor from among the primary and secondary electrical conductors is measured, and the first message comprises the value of that measured voltage, while during step c), an electric power and/or energy is calculated by the second module, from the value of the voltage measured during step a) and the intensity value measured by the current sensor, while during step d), the second message further contains the calculated value of the electric power and/or energy, while during step e), a sum of the received power or energy values is further calculated by the third module,
- during the measurement in step c), the measured intensity is sampled using a sampling frequency and the measured intensities are decomposed into a Fourier series, while during the calculation in step e), the electric quantity is calculated from values of the complex Fourier coefficients obtained in step c) up to a predetermined harmonic rank.
- during the measurement in step c), the measured intensity is sampled using a sampling frequency, the samples are successively acquired over several periods of the voltage of a corresponding conductor from among the primary and secondary electrical conductors, and according to increasing values of a sampling rank during a given period the value of the rank being reset at the end of each period, and a mean of the samples having a same rank value is done, while during the calculation in step e), the electric quantity is calculated from mean values of the samples obtained in step c),
- during step a), the first message further contains a reception request for the intensity and/or electric power and/or energy values measured or calculated by the second modules.

Owing to the invention, the quasi-simultaneous measurement of the intensity by each current sensor of each second module makes it possible to perform operations, such as additions, on the different measured instantaneous complex intensities, as well as on instantaneous complex powers and/or on energies calculated, inter alia, from different measured intensities.

Figure 2:
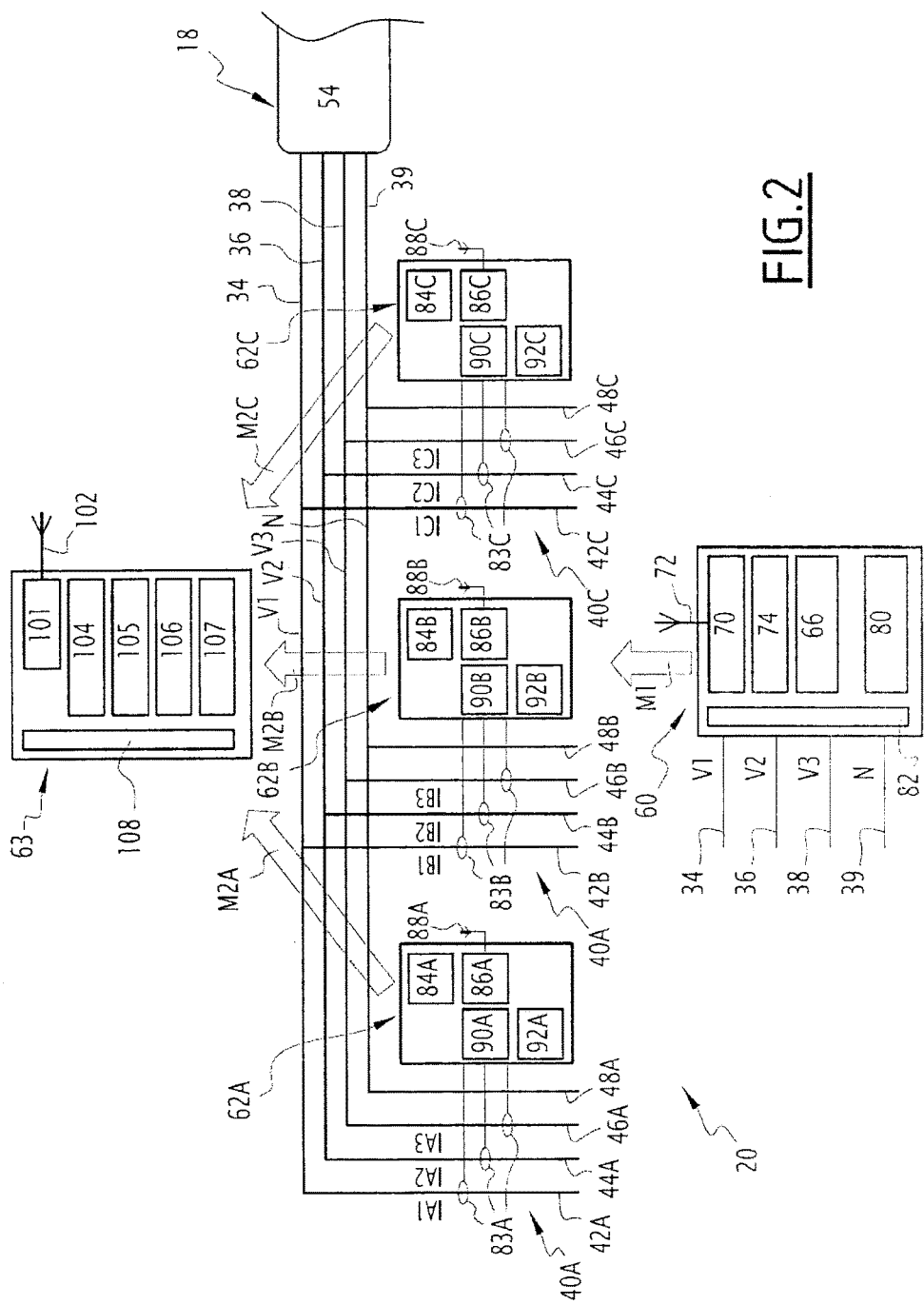
Figure 3:
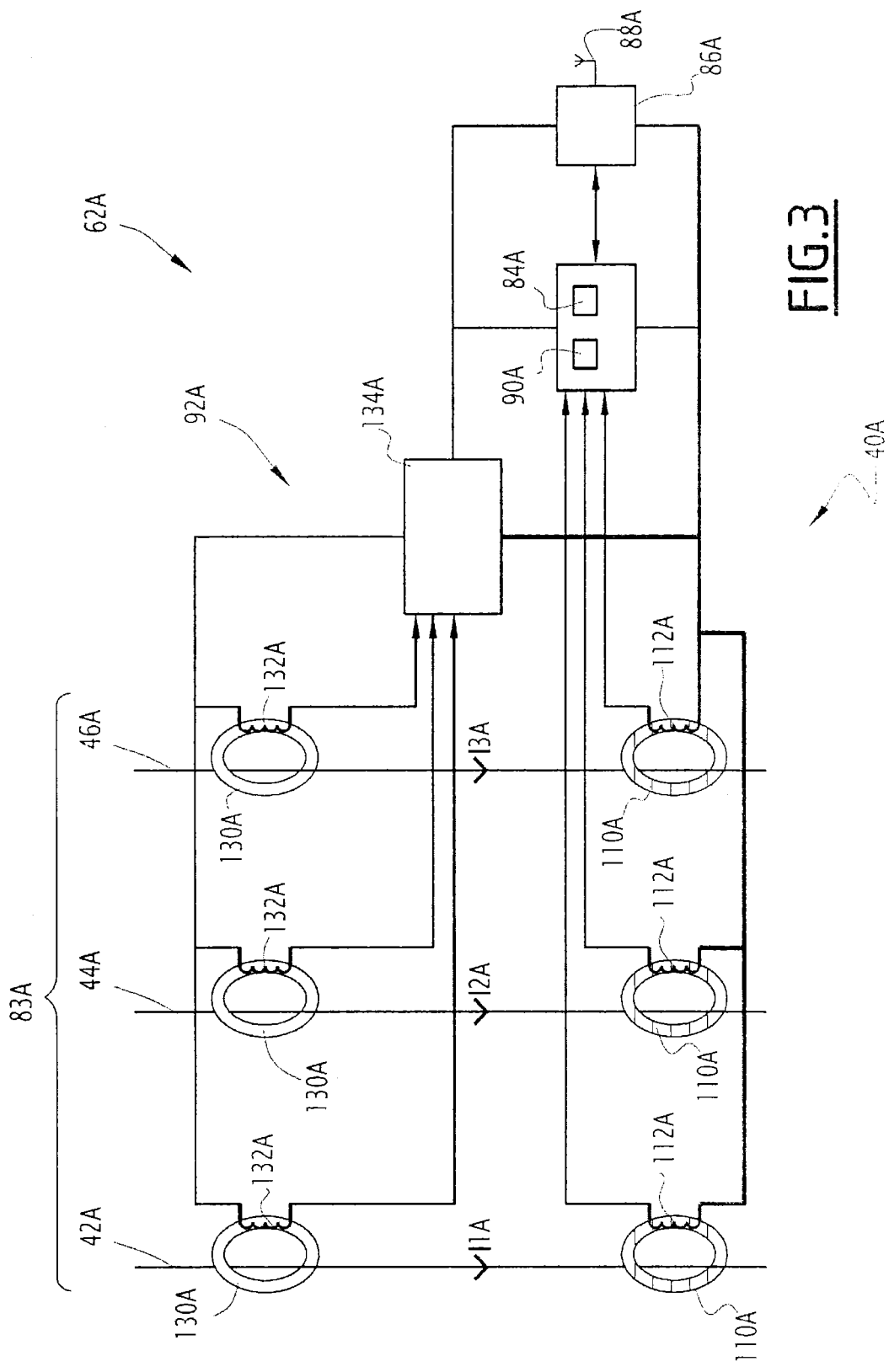
Figure 4:
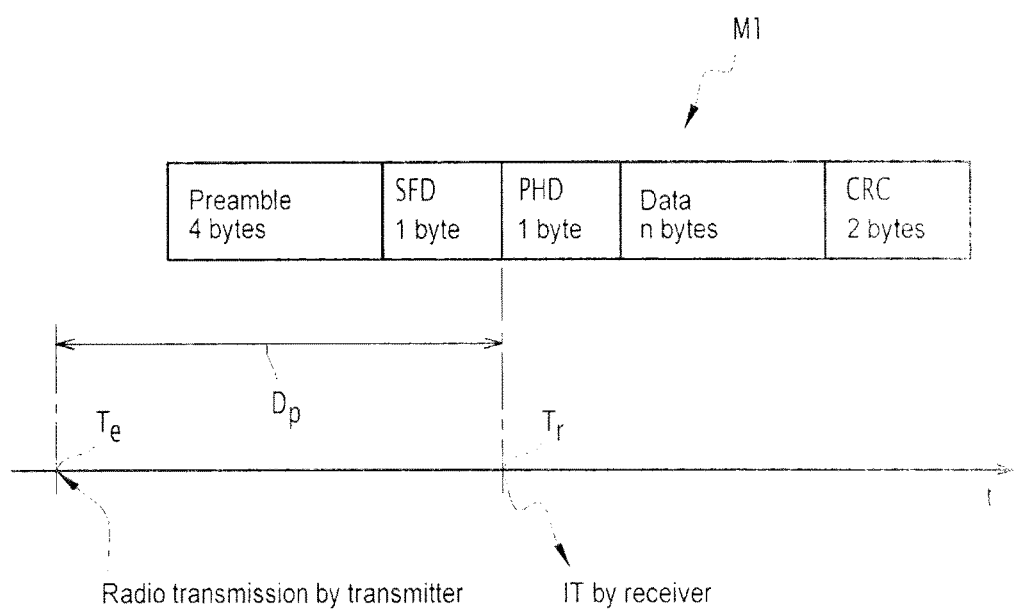
Figure 5:
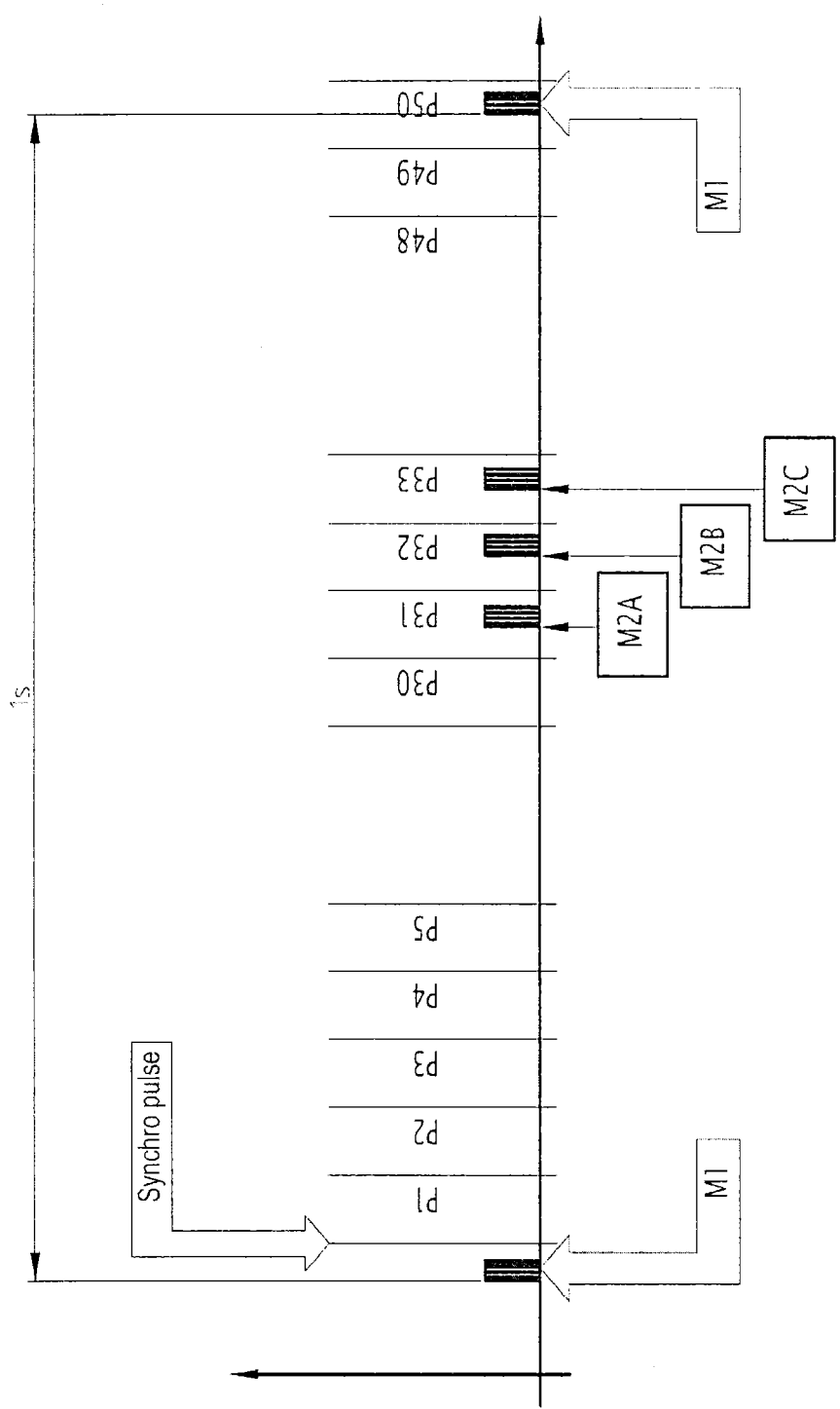
Figure 6:
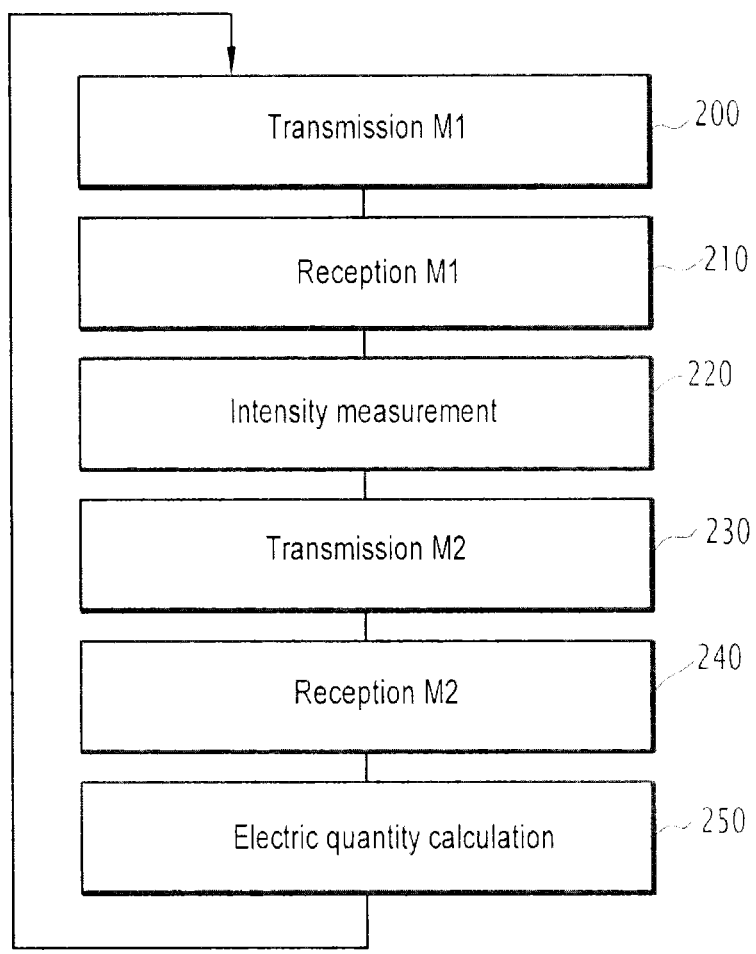
Figure 7:
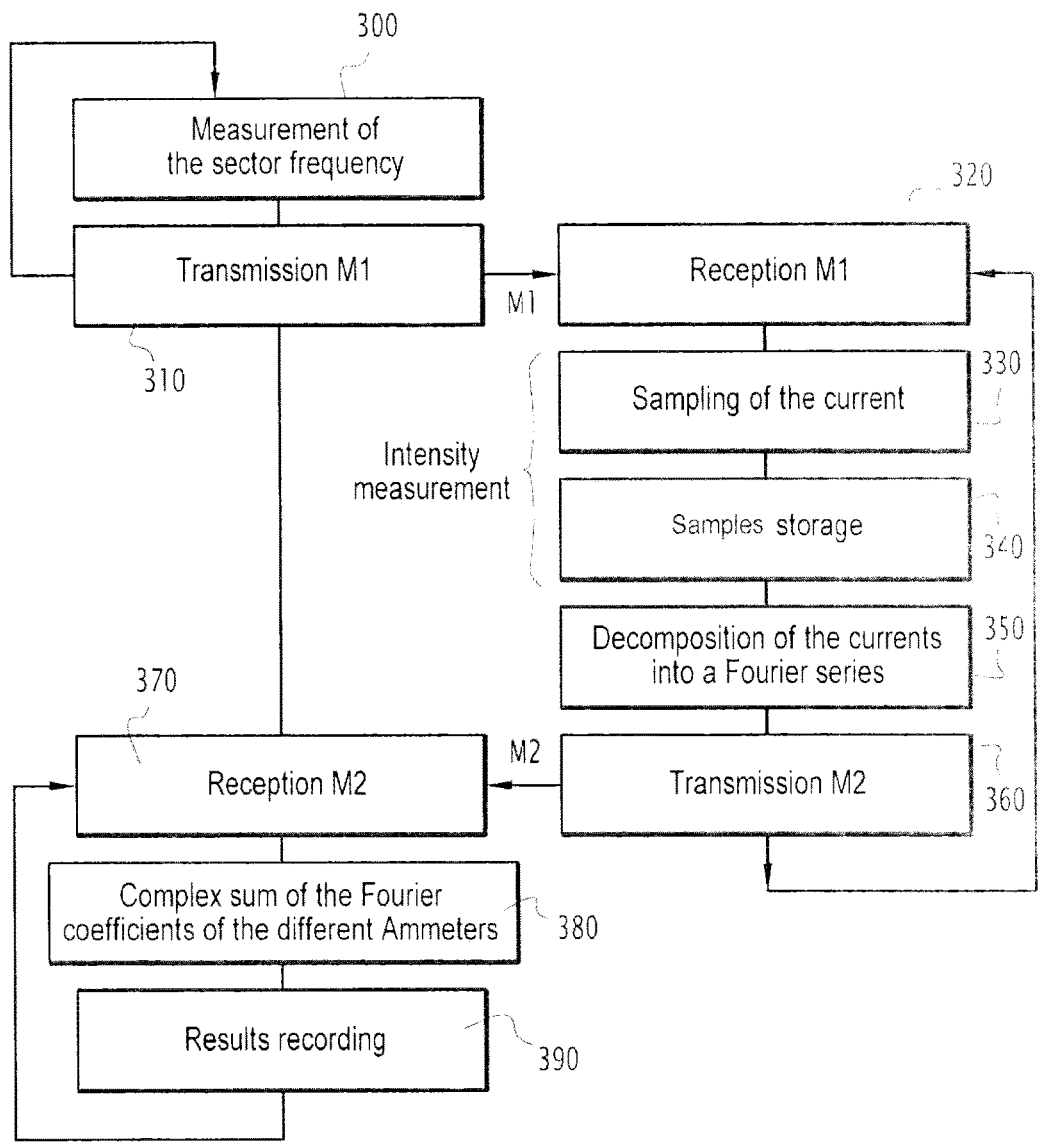
Figure 8:
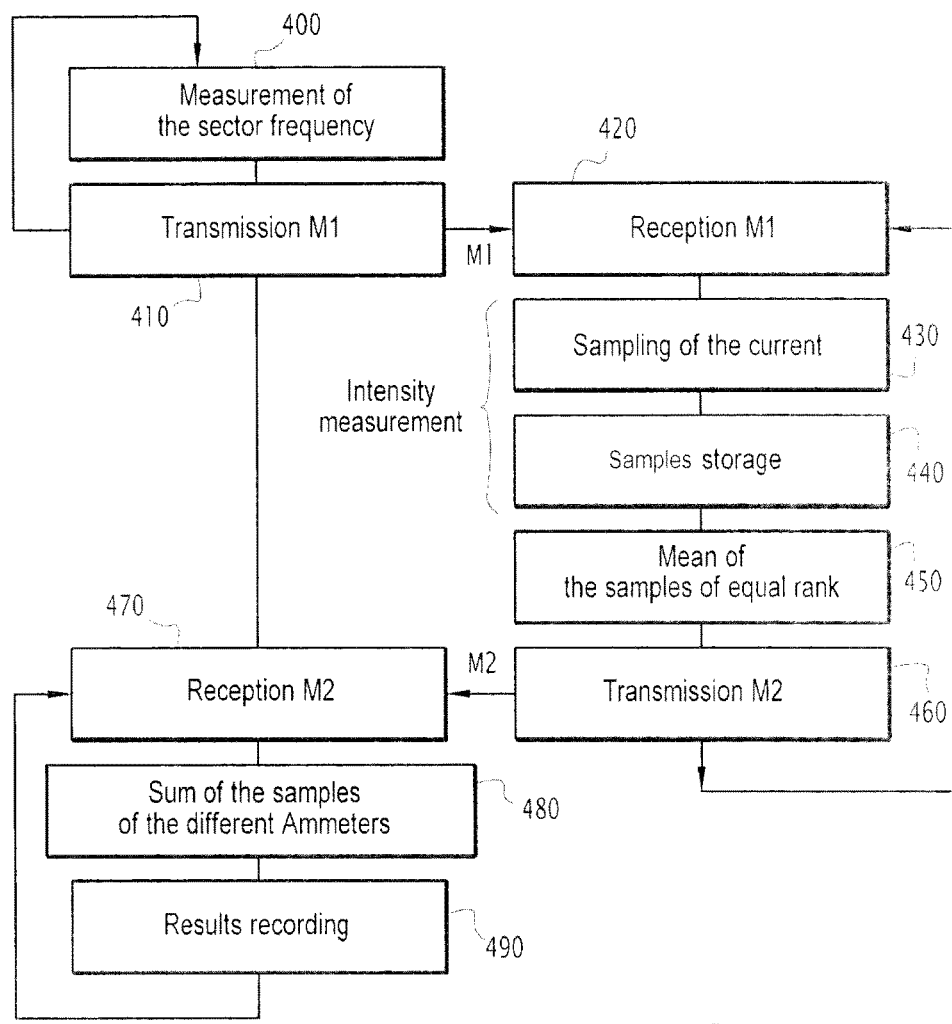
Figure 9:
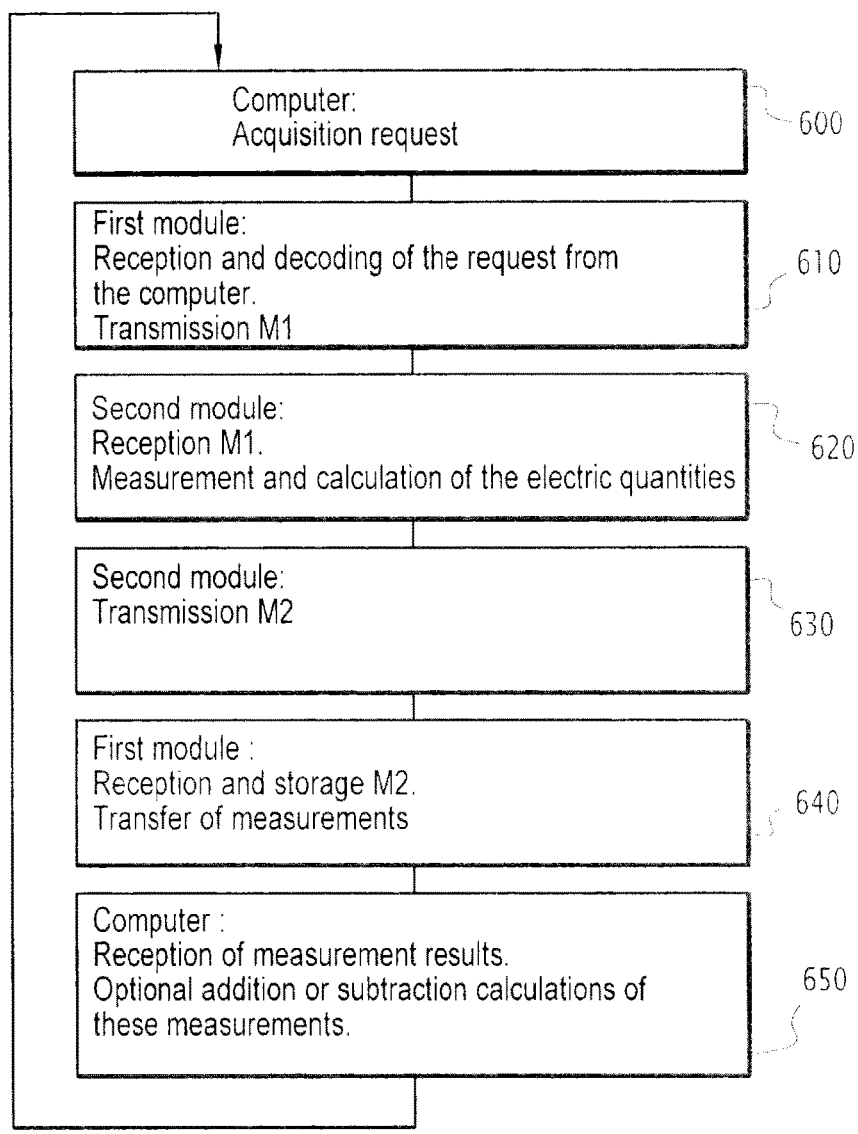

The invention will be better understood, and other advantages thereof will appear more clearly, in light of the following description, provided solely as a non-limiting example, and done in reference to the appended drawings, in which:

FIG. 1 is a diagrammatic illustration of a transformer substation comprising a first panel, a second panel connected to the first panel by means of a transformer, and a system for calculating an electric quantity according to the invention, FIG. 2 is a diagrammatic illustration of the calculating system of FIG. 1, the calculating system comprising first, second and third modules, the second panel comprising three outgoing electrical lines, FIG. 3 is a diagrammatic illustration of the second module of FIG. 2, FIG. 4 is a timing chart showing the sending and reception moments of a first message, the latter being transmitted by the first module to each second module, FIG. 5 is a timing chart showing the transmission of the first and second messages and their processing, FIG. 6 is a flowchart of the steps of a method for calculating the electric quantity according to a first embodiment, FIGS. 7 to 9 are views similar to that of FIG. 6 according to second, third and fourth embodiments, respectively.

In FIG. 1, a transformer substation 10 connected to an electric network 12 comprises a first panel 14, a second panel 16, an electric transformer 18 connected between the first panel 14 and the second panel 16, and a system 20 for calculating an electric quantity such as an electric energy, an electric power or electric intensity.

The transformer substation 10 is capable of transforming the electric current delivered by the network 12 and having a first alternating voltage, into an electric current having a second alternating voltage.

The electric network 12 is an alternating network, such as a three-phase network. The electric network 12 is a medium-voltage network, i.e., a network whereof the voltage is greater than 1000 V and less than 50,000 V. The first three-phase voltage is then a medium voltage.

Alternatively, the electric network 12 is a high-voltage network, i.e., a network with a voltage greater than 50,000 V. In other words, the first three-phase voltage is a high voltage.

The first panel 14 includes several incoming lines 22A, 22B, each incoming line 22A, 22B including a first 24A, 24B, second 26A, 26B, and third 28A, 28B incoming conductor. Each first, second, third incoming conductor 24A, 24B, 26A, 26B, 28A, 28B is connected to the electric network by means of a respective incoming circuit breaker 32. The three-phase current circulating in the corresponding incoming conductors 24A, 24B, 26A, 26B, 28A, 28B has the first three-phase voltage.

The second panel 16 comprises a first 34, second 36, third 38 and fourth 39 primary conductor and a plurality N of outgoing lines 40A, 40B, . . . , 40N, i.e., a first outgoing line 40A, a second outgoing line 40B, . . . , an Nth outgoing line 40N, each outgoing line 40A, 40B, . . . , 40N being capable of delivering a three-phase voltage.

Each outgoing line 40A, 40B, . . . , 40N is a low-voltage outgoing line, i.e., an outgoing line with a voltage of less than 1000 V. The second three-phase voltage is then a low voltage.

Alternatively, each outgoing line 40A, 40B, . . . , 40N is a medium-voltage outgoing line, i.e., an outgoing line with a voltage greater than 1000 V and less than 50,000 V. In other words, the second three-phase voltage is a medium voltage.

The first outgoing line 40A includes a first 42A, second 44A, third 46A and fourth 48A secondary conductor and three outgoing circuit breakers 50. The first, second and third secondary conductors 42A, 44A, 46A are respectively connected to the first, second and third primary conductors 34, 36, 38 by a corresponding outgoing circuit breaker 50. The fourth secondary connector 48A is directly connected to the fourth primary conductor 39.

The outgoing primary conductors 34, 36, 38, and the corresponding secondary outgoing conductors 42A, 44A, 46A have substantially the same voltage, i.e., a first voltage V1, a second voltage V2 and a third voltage V3, respectively, corresponding to the three phases of the second three-phase voltage relative to the neutral conductor 39.

The other outgoing lines 40B, . . . , 40N are identical to the first outgoing line 40A previously described, and include the same elements, each time replacing the letter A by the corresponding letter B, . . . , N regarding the references for the elements.

The electric transformer 18 is capable of transforming the current coming from the electric network having the first alternating voltage into the current delivered to the second panel 16 and having the second alternating voltage. The electric transformer 18 includes a primary winding 52 connected to the first panel 14 and a secondary winding 54 connected to the second panel 16.

The calculating system 20 is capable of calculating an electric quantity of the intensity, electric energy and/or instantaneous electric power type in each secondary outgoing conductor 42A, 44A, 46A, 48A, 42B, 44B, 46B, 48B, . . . , 42N, 44N, 46N, 48N.

In the illustration of FIG. 2, the second panel is shown with the number N of outgoing lines equal to 3. Thus, the second panel 16 comprises a first 34, second 36, third 38 and fourth 39 primary conductor and three outgoing lines 40A, 40B, 40C.

The calculating system 20, shown in FIG. 2, comprises a first module 60 connected to the primary conductors 34, 36, 38, 39, three second modules 62A, 62B, 62C, namely a respective second module 62A, 62B, 62C for each outgoing line 40A, 40B, 40C, the second module 62A, 62B, 62C being connected to the outgoing secondary conductors 42A, 44A, 46A, respectively; 42B, 44B, 46B, respectively; and 44C, 46C, 46C, respectively. Additionally, the calculating system 20 comprises a third module 63.

The first module 60 includes a measuring unit 66, a wireless transmitter 70, a wireless antenna 72, a microcontroller 74, a communication unit 80 and a unit 82 for providing electric power to these different elements.

For each of the first 42A, second 44A and third 46A secondary conductors, the second module 62A includes a current sensor 83A capable of measuring the intensity of the current circulating in the corresponding secondary conductor 42A, 44A, 46A. It additionally comprises a microcontroller 84A, a wireless transceiver 86A, a wireless antenna 88A, an analog-digital converter 90A and a unit 92A providing electricity to those elements.

The other second modules 62B, 62C are identical to the second module 62A previously described, and include the same elements, each time replacing the letter A with the corresponding letter B, C regarding the references for the elements.

The third module 63 includes a wireless receiver 101, a wireless antenna 102, a calculating unit 104, a data storage and time stamping unit 105, a man-machine interface 106, a communication unit 107 and a unit 108 supplying electricity to these different elements.

The measuring unit 66 is capable of measuring the frequency F of the three-phase voltage of the primary conductors 34, 36, 38.

The wireless transmitter 70 is preferably according to the ZIGBEE or ZIGBEE GREEN POWER communication protocol based on standard IEEE-802.15.4. Alternatively, the wireless transmitter 70 is preferably in accordance with standard IEEE-802.15.1 or standard IEEE-802.15.2. Also alternatively, the wireless transceiver 70 is preferably according to standard IEEE-802-11. Without meeting an IEEE standard, this transmitter may also simply comply with the regulations in force in each country (proprietary radio communication solution).

The wireless antenna 72 is suitable for transmitting wireless signals to antennas 88A, 88B, 88C of the second modules 62A, 62B, 62C. In other words, the first module 60 is connected to each of the second modules 62A, 62B, 62C by a corresponding wireless link.

The microcontroller 74 is capable of storing and executing a software application, not shown, for transmitting a first message M1 to each second module 62A, 62B, 62C, the transmission software being capable of cooperating with the wireless transmitter 70 and the wireless antenna 72.

The communication unit 80 allows communication by the first module 60 with an outside unit, not shown, using a communication link, preferably standardized, such as a link of the ModBus Serial Line Protocol type, or ModBus TCP/IP or any other protocol using IP.

The current sensor 83A is capable of measuring a respective intensity from among a first intensity IA1 circulating in the first secondary outgoing conductor 42A, a second intensity IA2 circulating in the second secondary outgoing conductor 44A, and a third intensity IA3 circulating in the third secondary outgoing conductor 46A.

Additionally, the analog digital converter 90A is capable of using a sampling frequency $F_{ECH}$ to sample the values of the intensity IA1, IA2, IA3 measured by the current sensor 83A. Thus, the analog digital converter 90A, as well as the analog digital converters 90B and 90C, further form a sampling unit.

The current sensor 83A includes a first toroid 110A positioned around the corresponding secondary outgoing conductor 42A, 44A, 46A and a first winding 112A arranged around the first toroid, as shown in FIG. 3. The circulation of current through the corresponding outgoing secondary conductor is capable of creating an induced current proportional to the intensity of the current in the first winding 112A. The first toroid 110A is a Rogowski toroid. The first toroid 110A is preferably an opening toroid in order to facilitate its arrangement around the corresponding conductors.

The microcontroller 84A is capable of storing and executing a software application for the acquisition of sampled values by the analog digital converter 90A with respective intensities IA1, IA2, IA3, software for receiving the first message M1, software for compressing the sampled values of the first, second and third intensities IA1, IA2, IA3, and software for sending a second message M2A intended for the third module 63, not shown.

The wireless transceiver 86A is of the same type as the wireless transmitter 70.

The wireless antenna 88A is suitable for receiving wireless signals from the antenna 72 and also for transmitting wireless signals to the antenna 101.

The power supply unit 92A of the second module 62A includes, for each of the first 42A, second 44A and third 46A secondary conductors, a second toroid 130A positioned around the corresponding secondary conductor 42A, 44A, 46A and a second winding 132A arranged around the second toroid. The circulation of the current in the corresponding secondary conductor 42A, 44A, 46A is capable of creating an induced current in the second winding 132A. In other words, the second module 62A is automatically powered by each second toroid 130A and each second winding 132A, which recover the magnetic energy and form a current transformer.

The power supply unit 92A includes a converter 134A connected to each of the second windings 132A and capable of delivering a predetermined voltage to the wireless transceiver 86A, the microcontroller 84A and the analog digital converter 90A. Each second toroid 130A is an iron toroid. Each second toroid 130A is preferably an opening torpid in order to facilitate its arrangement around the corresponding conductors.

In other words, the secondary module 62A is self-powered by the power supply unit 92A including the second toroids 130A suitable for recovering the magnetic energy from the circulation of the current in the corresponding secondary conductors 42A, 44A, 46A.

The elements of the other second modules 62B, 62C are identical to the elements of the second module 62A previously described and include the same sub-elements, each time replacing the letter A with the corresponding letter B, C, regarding the references of the sub-elements.

Alternatively, the second modules 62A, 62B, 62C are powered by the sector, i.e., they are not self-powered.

The wireless receiver 101 is of the same type as the wireless transmitter 70.

The wireless antenna 102 is suitable for receiving wireless signals from said antennas 88A, 88B, 88C.

The calculating unit 104 is capable of storing and executing a software application for receiving second messages M2A, M2B, M2C and a software application for calculating a sum of intensities or powers from data comprised in the second messages M2A, M2B, M2C The unit 105 is capable of storing and time stamping received data as well as the results of calculations the second messages M2A, M2B, M2C.

The man-machine interface 106 of the third module 63 includes a display screen and an entry keyboard, not shown. Alternatively, the man-machine interface 106 includes a touchscreen, and data is entered using the touch keys displayed on the screen.

The communication unit 107 is of the same type as the communication unit 80.

The calculating system 20 described above makes it possible to measure and calculate intensities and add them, and the system 20 is, according to an embodiment complementary to that previously described, also capable of calculating electric powers and electrical energies and calculating sums of electric powers or electrical energies. In this complementary embodiment, the measuring unit 66 is capable of measuring the voltage of the current circulating in the primary conductors 34, 36, 38. More specifically, the measuring unit 66 is capable of measuring the first voltage V1 of the phase circulating through the first primary conductor 34, also called phase number 1 and denoted Phase_1, the second voltage V2 of the phase circulating through the second primary conductor 36, also called phase number 2 and denoted Phase_2, and the third voltage V3 of the phase circulating through the third primary conductor 38, also called phase number 3 and denoted Phase_3. Furthermore, the power supply unit 82 is capable of supplying electricity to the measuring unit 66 from the three-phase voltage circulating through the primary conductors 34, 36, 38.

In this complementary embodiment, the microcontroller 84A is capable of storing and executing a software application for calculating the electric energy EA1, EA2, EA3, the intensity IA1, IA2, IA3 circulating in the corresponding secondary conductor 42A, 44A, 46A, and the instantaneous power QA1, QA2, QA3 of the current IA1, IA2, IA3 circulating in the corresponding secondary conductor 42A, 44A, 46A.

The elements of the other second modules 62B, 62C are identical to the elements of the second module 62A previously described and bear the same sub-elements, replacing the letter A each time with the corresponding letter B, C regarding the references of the sub-elements or the quantities calculated by the sub-elements.

The calculating unit 104 is capable of storing and executing a software application for calculating sums of real electrical energies EA1, EA2, EA3, EB1, EB2, EB3, EC1, EC2, EC3 and complex instantaneous electric powers QA1, QA2, QA3, QB1, QB2, QB3, QC1, QC2, QC3 from data received via the second messages M2A, M2B, M2C.

In the example of FIG. 2, the calculating system 20 comprises three second modules 62A, 62B, 62C and the transformer has three outgoing lines 40A, 40B, 40C, and one skilled in the art will understand that the calculating system 20 generally comprises N outgoing lines and N second modules, N being an integer greater than 1.

The operation of the calculating system 20 will now be explained, and four embodiments of the calculating method according to the invention are successively described.

All of these embodiments share an initialization step, which precedes all of the steps described thereafter, and has not been shown in the various figures. This initial step makes it possible to sequence the sending of the second messages M2A, M2B, M2C to the third module 63. In this initial step, the first module 60 sends the second modules 62A, 62B, 62C a third message M3 specific to each second module 62A, 62B, 62C and containing a different order number allocated to each second module. In other words, each second module 62A, 62B, 62C receives, from the first module 60, an order number that it stores and that determines a period $P_{tension}$ of the three-phase voltage during which the second module roust send the second message M2A, M2B, M2C.

As shown in FIG. 5, the first message M1 is sent every second and during each second, the steps leading to the calculation of the desired electric quantities are carried out. Thus, if the period $P_{tension}$ of the three-phase voltage is 20 ms as shown in FIG. 5, that second is divided into 50 periods denoted P1, P2, . . . , P50. During these periods P1, P2, . . . , P50, the different tasks are distributed and the different steps of the calculating method are carried out. The first five periods P1, P2, P3, P4, P5 correspond to the sampling of the current and the performance of the compression that are described hereinafter. Furthermore, knowing that after the initialization and sending of the message M3, the second modules know their order number, the transmission periods of the second messages M2A, M2B, M2C are known. Thus, the second module 62A has the order number one and transmits the message M2A in period 31, the second module 62B has order number two and transmits the message M2B in period 32, and so forth, knowing that these order numbers for example go from 1 to 16, the transformer substation 10 for example including a maximum of 16 outgoing lines. In the described example, the transformer substation 10 includes three modules 62A, 62B, 62C, and the order number is therefore comprised between 1 and 3. This sequencing of the second modules 62A, 62B, 62C, and more particularly of the second messages M2A, M2B, M2C that they send, makes it possible to avoid a collision between the different second messages M2A, M2B, M2C.

According to a first embodiment of the calculating method, corresponding to FIG. 6, during a first step 200, the first module 60 transmits the first message M1 to each of the second modules 62A, 62B, 62C, via the wireless antenna 72. This first message M1 is a synchronization message for each current sensor 83A, 83B, 83C.

The first message M1 is preferably transmitted periodically. The transmission period $P_{emission}$ is predetermined, and preferably equal to one second. In other words, the first message M1 is sent every second, as shown in FIG. 5.

The first message M1 contains a synchronizing pulse of the current sensors 83A, 83B, 83C. More specifically, for example, the first message M1 comprises a header field, also called preamble, an SFD (Start of Frame Delimiter) field, a PHR (Physical Header) field, a data field, and a CRC (Cyclic Redundancy Check) field. The preamble has a size of 4 bytes, the SFD and PHR fields each of a size of one bite, the size of the data field varies, and is denoted n bytes, and the CRC field has a size of 2 bytes. In the example embodiment of FIG. 4, the first message M1 is made up of the header field, the SFD field, the PHR field, the data field and the CRC field. The reception of the SFD by the modules 62A, 62B and 62C constitutes the synchronizing pulse (FIG. 4).

Additionally, during step 200, the first module 60 measures the first, second and third voltages V1, V2, V3 using the measuring unit 66 and the data field of the first message M1 further contains the values of the complex voltages V1, V2, V3.

After transmission of the first message M1, the first module 60 waits for a predetermined length of time before again transmitting a first message M1.

The steps specific to each second module 62A, 62B, 62C will now be described.

During a step 210 for receiving the first message M1, each second module 62A, 62B, 62C waits for the synchronizing pulse from the first message M1. In other words, each second module 62A, 62B, 62C periodically opens windows to receive the first message M1 until it receives the first message M1. If the first message M1 is received, the second module 62A, 62B, 62C will open a listening window of several milliseconds for the next first message M1 a little less than one second after receiving the first message M1. If the first message M1 is not received, the second module 62A, 62B, 62C once again opens a window to receive the first message M1 one second later.

More specifically, when the first message M1 is received, the second module 62A, 62B, 62C detects the reception moment Tr of the SFD field, the reception of the SFD field causing the activation of an interruption by the wireless receiver of each second module 62A, 62B, 62C, immediately after the demodulation of the SFD. The detection of the reception moment Tr then makes it possible to calculate, if necessary, the moment Te at which the first message M1 was transmitted by the wireless transmitter of the first module 60. The transmission moment Te is in fact equal to the reception moment Tr minus a propagation duration Dp for the first message M1 via the wireless link between the first module 60 and the second modules 62A, 62B, 62C, the propagation duration Dp being fixed and known for a predetermined size of the data field of the first message M1.

Once the first message M1 has been received by the wireless antennas 88A, 88B, 88C, each second module 62A, 62B, 62C then measures the three currents IA1, IA2, IA3, IB1, IB2, IB3, IC1, IC2, IC3 of the three phases, quasi-simultaneously and with a synchronizing margin of error preferably smaller than 10 μs, still more preferably equal to 1 μs, during a step 220 and using its current sensors 83A, 83B, 83C of its analog-to-digital converters 90A, 90B, 90C and its microcontroller 84A, 84B, 84C, and samples the measured values. The samples are stored by the microcontroller 84A.

Additionally, during step 220, each second module 62A, 62B, 62C respectively calculates, using the corresponding microcontroller 84A, 84B, 84C, and periodically, the active energy EA1, EA2, EA3, EB1, EB2, EB3, EC1, EC2, EC3 for each of the three phases from the values of the voltages V1, V2, V3 measured and received from the primary module 60 via the first message M1 and the values of the intensities IA1, IA2, IA3, IB1, IB2, IB3, IC1, IC2, IC3 measured by the current sensor 83A, 83B, 83C. The calculation period for the active energies EA1, EA2, EA3 is equal to the period $P_{tension}$, i.e., for example, 20 ms. Likewise, from the voltage V1, V2, V3 and current IA1, IA2, IA3, IB1, IB2, IB3, IC1, IC2, IC3 values, each second module 62A, 62B, 62C is capable of respectively calculating the electrical instantaneous powers QA1, QA2, QA3, QB1, QB2, QB3, QC1, QC2, QC3 of the three phases.

During a step 230, each second module 62A, 62B, 62C transmits a second message M2A, M2B, M2C specific to it according to the sequencing described during the description of the initialization step. The second message M2A, M2B, M2C respectively contains the samples of the measured intensities IA1, IA2, IA3; IB1, IB2, IB3; IC1, IC2, IC3.

Additionally, during the step 230, the second message M2A, M2B, M2C contains the corresponding calculated electric energy values EA1, EA2, EA3, EB1, EB2, EB3, EC1, EC2, EC3 and electric power values QA1, QA2, QA3, QB1, QB2, QB3, QC1, QC2, QC3.

Then, during a step 240, the third module 63, which is listening for the second messages M2A, M2B, M2C, receives those second messages. The samples with intensities IA1, IA2, IA3, IB1, IB2, IB3, IC1, IC2, IC3 contained in the corresponding second messages M2A, M2B, M2C are then recovered.

Additionally, during the step 240, the electric energy and electric power values are received, and during step 250, the electric energy and power sums are calculated in order to determine the energy and power in the primary conductor 34, 36, 38.

During step 250, the third module 63 next uses the received samples to calculate the sum of the intensities of the current circulating in each secondary conductor 42A, 44A, 46A, 42B, 44B, 46B, 42C, 44C, 46C using the calculating unit 104, in order to obtain the value of the intensity of the current circulating in the primary conductor 34, 36, 38.

The calculating method according to the second embodiment will now be described using FIG. 7.

During a step 300, the first module 60 measures the frequency F of the three-phase voltage, i.e., the frequency of the voltages V1, V2, V3 of the primary outgoing conductors 34, 36, 38. This measurement of the frequency F is done using the measuring unit 66. The first module 60 therefore sends, during a step 310 similar to the step 200, a first message M1 similar to that previously described, knowing that in its data field, the message M1 also contains the frequency F of the three-phase voltage, or alternatively the sampling period $P_{ECH}$ used for sampling of the intensities measured by each current sensor 83A, 83B, 83C. The inverse of the sampling period $P_{ECH}$ is a multiple of the frequency F. The sampling frequency $F_{ECH}$ is for example chosen with a value 36 times greater than that of the frequency F. At the end of step 310, the first module 60 waits for a predetermined time before restarting the measurement of the frequency F and retransmitting the first message M1; it waits approximately one second.

The following step 320 for receiving the message M1 is similar to the step 210 previously described.

Then, during a step 330, the intensity is sampled over several periods $P_{tension}$ of the three-phase voltage, synchronously for all of the current sensors 83A, 83B, 83C. In the considered example, the sampling is done over five periods of the three-phase voltage $P_{tension}$. The value of the sampling frequency $F_{ECH}$ is known, that value having been sent in the message M1 or having been calculated from the frequency F of the three-phase voltage sent in the first message M1.

During a following step 340, the samples are stored in memory by the microcontroller 84A, 84B, 84C, and next, during a step 350, the samples are compressed in order to limit the quantity of data sent by the second switches M2A, M2B, M2C. The compression step 350 will be described for the second module 62A, and is identical for each second module 62A, 62B, 62C by replacing the letter A with the letter B, C, respectively.

During the compression step 350, the microcontroller 84A for example calculates a predetermined number K of first complex coefficients Re(IAiHj), Im(IAiHj) of the Fourier series decomposition of the three currents IA1, IA2, IA3 of the three phases, where i is the number equal to 1, 2 or 3 of the phase, and j is comprised between 1 and K. The predetermined number K is preferably equal to 5 and corresponds to a predetermined harmonic rank, i.e., to the number of harmonics considered for the calculations, i.e., again with a calculating precision.

The coefficients of the decomposition into a Fourier series are for example obtained by correlation operations on the samples of the measured values. More specifically, the real coefficient of the fundamental, also denoted Re(IAiH1), is a correlation, over a length of time equal to the period $P_{tension}$ of the three-phase voltage, between the samples of the signal of the intensity IAi and a frequency cosine equal to the frequency F of the three-phase voltage, where IAi represents the intensity of phase number i, i being equal to 1, 2 or 3. The imaginary coefficient of the fundamental, also denoted IM(IAiH1), is a correlation, over a length of time equal to the period $P_{tension}$, between the samples of the signal with intensity Iai and a frequency sine equal to the frequency F.

The real coefficient of harmonic number j, denoted Re(IAiHj), j being comprised between 2 and K, is the correlation, over a length of time equal to the period $P_{tension}$, between the samples of the intensity signal Iai and a frequency cosine equal to j times the frequency F. The imaginary coefficient of harmonic number j, denoted Im(IAiHj), j being comprised between 2 and K, is the correlation, over a length of time equal to the period $P_{tension}$, between the samples of the signal of the intensity IAi and a frequency sine equal to j times the frequency F.

The microcontroller thus calculates the complex coefficients Re(IAiHj), Im(IAiHj), i going from 1 to 3 and j from 1 to K, of the decomposition into a Fourier series of the three intensities IA1, IA2, IA3 for the fundamental and the harmonics 2 to K.

These complex coefficients of the decomposition into a Fourier series are calculated, for example, as shown in FIG. 5, over the five first periods P1, P2, P3, P4, P5 of the three-phase voltage, then averaged over those five periods in order to decrease the measuring noise. This method makes it possible to have a sufficient number of measuring points in order to have a precise measurement that does not depend on the noise. The current is measured over the first 5 periods P1, P2, P3, P4, P5 after the synchronizing pulse, those periods being represented by vertical lines in FIG. 5 and each period being numbered.

Additionally, during step 350, the values of the real electrical energies EA1, EA2, EA3, EB1, EB2, EB3, EC1, EC2, EC3 and the complex powers QA1, QA2, QA3, QB1, QB2, QB3, QC1, QC2, QC3 according to each of the harmonics are calculated identically to what was previously described for step 220.

During a step 360, similar to step 230, each second module 62A, 62B, 62C transmits the second message M2A, M2B, M2C. However, in that case, the second message M2A, M2B, M2C respectively contains the value of the complex coefficients Re(IAiHj), Im(IAiHj), Re(IBiHj), Im(IBiHj), Re(ICiHj), Im(ICiHj), i going from 1 to 3 and j from 1 to K in increments of 1, decompositions into Fourier series of three intensities IA1, IA2, IA3; IB1, IB2, IB3; IC1, IC2, IC3 for the fundamental H1 and the harmonics 2 to K, instead of the samples of the measured intensities.

After sending the second messages M2A, M2B, M2C, each second module 62A, 62B, 62C returns to step 320 for receiving the first message M1.

During a following step 370, the third module 63 is listening for second messages M2A, M2B, M2C and receives the second messages M2A, M2B, M2C via its antenna 102. Then, the third module 63 uses its unit 105 to record and timestamp the complex coefficients Re(IAiHj), Im(IAiHj), Re(IBiHj), Im(IBiHj), Re(ICiHj), Im(ICiHj), i going from 1 to 3 and j from 1 to K by increments of 1, breakdowns into Fourier series of the three intensities IA1, IA2, IA3; IB1, IB2, IB3; IC1, IC2, IC3 for the fundamental and harmonics 2 to K.

Following the reception of the second messages M2A, M2B, M2C in step 370, the electric quantities are calculated during step 380, and the following values are obtained:
the modulus of the fundamental of each of the phases of the output current from the transformer:
  the real part of the fundamental of phase i, i going from 1 to 3, of the output current from the transformer is calculated using the following equation:

$$Re(IiH1)=Re(IAiH1)+Re(IBiH1)+Re(ICiH1) \quad (1)$$

the imaginary part of the fundamental of phase i, i going from 1 to 3, of the output current of the transformer is next calculated using the following equation:

$$Im(IiH1)=Im(IAiH1)+Im(IBiH1)+Im(ICiH1) \quad (2)$$

the modulus of the fundamental of each of the phases of the output current from the transformer is lastly obtained based on the following equations:

$$I1H1=\sqrt{([Re(I1H1)]^2+[Im(I1H1)]^2)} \quad (3)$$

$$I2H1=\sqrt{([Re(I2H1)]^2+[Im(I2H1)]^2)} \quad (4)$$

$$I3H1=\sqrt{([Re(I3H1)]^2+[Im(I3H1)]^2)} \quad (5)$$

the moduli of the harmonics of each of the phases of the output current from the transformer:
  the real part of the harmonic j, j going from 2 to K of the phase i, i going from 1 to 3, of the output current from the transformer is calculated using the following equation:

$$Re(IiHj)=Re(IAiHj)+Re(IBiHj)+Re(ICiHj) \quad (6)$$

the imaginary part of the harmonic j, j going from 2 to K of the phase i, i going from 1 to 3, of the output current from the transformer is next calculated using the following equation:

$$Im(IiHj)=Im(IAiHj)+Im(IBiHj)+Im(ICiHj) \quad (7)$$

the moduli of the harmonics of each of the phases of the output current from the transformer are lastly obtained using the following equations:

$$I1Hj=\sqrt{([Re(I1Hj)]^2+[Im(I1Hj)]^2)} \quad (8)$$

$$I2Hj=\sqrt{([Re(I2Hj)]^2+[Im(I2Hj)]^2)} \quad (9)$$

$$I3Hj=\sqrt{([Re(I3Hj)]^2+[Im(I3Hj)]^2)} \quad (10)$$

the modulus of the fundamental and harmonics of the neutral current at the output of the transformer, j going from 1 to K:
  the complex values of the fundamental of the neutral current at the output of the transformer are calculated using the following equations:

$$Re(InHj)=Re(I1Hj)+Re(I2Hj)+Re(I3Hj) \quad (11)$$

$$Im(InHj)=Im(I1Hj)+Im(I2Hj)+Im(I3Hg) \quad (12)$$

the modulus of the fundamental of the neutral current at the output of the transformer is then obtained using the following equation:

$$InHj=\sqrt{([Re(InHj)]^2+[Im(InHj)]^2)} \quad (13)$$

an approximate value of the currents Irms of each of the phases of the transformer is also obtained using the following equations, with, in the provided example, K=5:

$$Irms1=\sqrt{(([I1H1]^2+[I1H2]^2+[I1H3]^2+[I1H4]^2[Im(I1H5)]^2)/2)} \quad (14)$$

$$Irms2=\sqrt{(([I2H1]^2+[I2H2]^2+[I2H3]^2+[I2H4]^2[Im(I2H5)]^2)/2)} \quad (15)$$

$$Irms3=\sqrt{(([I3H1]^2+[I3H2]^2+[I3H3]^2+[I3H4]^2[Im(I3H5)]^2)/2)} \quad (16)$$

During step 380, the third module 63 is also capable of calculating the modulus of the fundamental of each of the phases of the current of each of the outgoing lines 40A, 40B, 40C, the moduli of the harmonics of each of the phases of the current of each of the outgoing lines 40A, 40B, 40C, the modulus of the fundamental of the neutral current of each of the outgoing lines 40A, 40B, 40C, the moduli of the harmonics of the neutral current of each of the outgoing lines 40A, 40B, 40C, the moduli of the harmonics of the general neutral current.

Additionally, during step 380 and similarly to FIG. 250, real electric energy sums EA1, EA2, EA3, EB1, EB2, EB3, EC1, EC2, EC3 and complex electric power sums QA1, QA2, QA3, QB1, QB2, QB3, QC1, QC2, QC3 are done similarly to what was described for the currents.

Lastly, during a step 390, the third module 63 records, in its unit 105, the results of the different calculations done. Additionally, the quantities measured and calculated by the calculating system 20 are next displayed on the screen of the man-machine interface 106 of the third module 63. These quantities are displayed in the form of numerical values and/or curves.

Following step 390, the third module 63 returns to listening mode for the second messages M2A, M2B, M2C.

The calculation method according to the third embodiment will now be described using FIG. 8.

During a step 400 similar to step 300, the first module 60 measures the frequency F. Then, similarly to what was described for step 310, the first module 60 transmits the first message M1 during a step 410.

During a step 420, the reception of the first message M1 is done similarly to what was described for step 320. Then, during steps 430 and 440, the current sampling and storage of the samples are done, similarly to what was described in steps 330 and 340, respectively.

The current sampling is done in step 430 over several periods $P_{tension}$, and more particularly over the first five periods P1, P2, P3, P4, P5. The samples are successively acquired over several periods $P_{tension}$ and according to increasing values of a sampling rank during a given period $P_{tension}$, the value of the rank being reset at the end of each period $P_{tension}$. In other words, for each period, the value of the rank increases as a function of time, i.e., the first sample for period P1 has rank 1, like the first sample for periods P2, P3, P4, P5, then the second sample in period P1 has rank 2, like the second sample for periods P2, P3, P4, P5, and so forth. For example, when the sampling frequency $F_{ECH}$ is chosen to be 36 times greater than the frequency F, for the five periods P1, P2, P3, P4, P5, there will be 36 samples whereof the ranks increase by increments of 1, increasing with time, from 1 to 36.

During step 450, a mean of the samples having a same sampling rank value is taken over said periods, in order to obtain mean samples.

During step 460, the operation is similar to that of step 360, with the difference that each second message M2A, M2B, M2C contains the value of the mean samples rather than the decomposition coefficients into a Fourier series.

During step 470, the second messages M2A, M2B, M2C are received and the operation of this step is similar to that of step 370, with the difference that the received values are mean samples, and not decomposition coefficients into a Fourier series.

After the reception of the second messages in step 470 by the third module 63, the electric quantities are calculated using the calculating unit 104 in a step 480, during which the sum of the samples measured by the different current sensors 83A, 83B, 83C is calculated, in order to calculate the value of the intensity of the current at the output of the transformer 18.

Lastly, a final step 490 is similar to step 390 previously described.

After step 490, the third module 63 returns to listening mode to listen for second messages M2A, M2B, M2C.

Once the calculations are done during steps 380 and 480 and with an installation similar to that of FIG. 2, the calculating system 20 and the calculating method according to the invention therefore make it possible to obtain the value of the intensity of the current at the output of the transformer, without using a current sensor at the output of the transformer.

Alternatively, compression means are used like those previously described in steps 440 and 540 in order to send the voltages V1, V2, V3. In the event the compression mean used is a decomposition into a Fourier series, the first module 60 comprises a compression software application capable of calculating a predetermined number K of first coefficients Re_j(Vi), Im_j(Vi) of the decomposition into a Fourier series of each of the voltages V1, V2, V3 of the three phases, where i is the number equal to 1, 2 or 3 of the phase, and j is comprised between 1 and K. The predetermined number K is preferably equal to 5. The coefficients for the decomposition into a Fourier series are for example obtained by correlation operations on the samples of the measured values, as previously explained in the case of the currents.

Additionally, the complex electric power QA1, QA2, QA3, QB1, QB2, QB3, QC1, QC2, QC3 and real electric energy EA1, EA2, EA3, EB1, EB2, EB3, EC1, EC2, EC3 sums are calculated. To that end, the module 63 uses the data sent by the message M1 relative to the voltages V1, V2, V3.

Additionally, the data field of the first message M1 contains the values of the quadratic means, also denoted RMS (Root Mean Square), for each of the three voltages V1, V2, V3.

The calculating method according to the fourth embodiment will now be described using FIG. 9.

According to the fourth embodiment, the calculating system 20 comprises a computer, not shown, capable of sending an acquisition request for the second messages M2A, M2B, M2C to the first module 60 during a step 600. When the computer requests sending of the second messages M2A, M2B, M2C, the first module 60 receives that request during a step 610 and sends the request to each second module 62A, 62B, 62C via the data field of the first message M1.

Then, during a step 620, the reception of the first message M1 and the measurement of the current are done by each second module 62A, 62B, 62C, similarly to what was described in steps 210 and 220.

During a following step 630, each second module 62A, 62B, 62C develops a second message M2A, M2B, M2C and sends it similarly to what was described for step 230.

The measured and calculated quantities, sent via the second messages M2A, M2B, M2C to the third module 63, are received and stored in a results table and sent to the computer during a step 640.

Lastly, during a step 650, the computer performs calculation operations, such as intensity sums, power sums or energy sums, as previously described for step 250. The computer is capable of displaying a centralized management of the measured and calculated quantities. At the end of step 650, the computer returns to step 600 if needed, in order to request a new acquisition of the quantities measured by the second modules.

The fourth embodiment described above is an adaptation of the first embodiment, and one skilled in the art will understand that similar adaptations of the second and third embodiments are possible.

Additionally, each second message M2A, M2B, M2C contains the identifier of the second module 62A, 62B, 62C sending it.

According to one alternative, during step 200, the first module 60 requests, via the first message M1, the sending of the second messages M2A, M2B, M2C. The first message M1 then contains a specific request field and the measured intensities and/or the calculated values are sent, by means of the second messages M2A, M2B, M2C, to the third module 63 only when that specific field is present in the first message M1. Thus, the number of wireless messages decreases greatly, which limits the risks of scrambling on other applications and makes it possible to optimize the energy of the second modules 62A, 62B, 62C.

The calculating system 20 according to the invention makes it possible to perform synchronized measurements of the current circulating in each outgoing line, and it is thus possible to add the measured values or the calculated quantities from these intensity values, such as the instantaneous energy or power.

All of the modules 60, 62A, . . . , 62C, 63 are connected to each other by wireless links by means of their respective wireless transmitters and/or receivers 70, 88A, . . . , 88C, 102, which makes it possible to facilitate the installation of the calculating system 20 in the transformer substation 10.

Compressing the data relative to the measured voltages and intensities makes it possible to limit the quantity of data sent via the wireless links, and to thereby limit the specific energy consumption of the calculating system 20 itself. Furthermore, compressing the data makes it possible to reduce the sensitivity of the calculating system 20 to wireless disruptions of the scrambling or electromagnetic compatibility disruption type, also called EMC disruption.

Sequencing the second modules makes it possible to reduce the wireless interference between the secondary modules 62A, . . . , 62C.

According to another embodiment that is not shown, the first module 60 and the third module 63 form only one single module transmitting the first messages M1, the reception of the second messages M2A, M2B, M2C and the calculations of the electric quantities. This then makes it possible to reduce the cost of the calculating system 20.

The other advantages of this embodiment are identical to those of the first embodiment previously described. The operation of this embodiment is also identical to that previously described.

In the example embodiment of FIGS. 1 to 9 previously described, the electric network 12 is a three-phase network, and the current measured by means of the calculating system 20 is a three-phase current. One skilled in the art will of course understand that the invention also applies to a single-phase electric network and the measurement of a single-phase alternating current.

One can thus see that the calculating system 20 according to the invention is less complex and less expensive.

Alternatively, the second message M2A additionally contains the mean IArms1, IArms2, IArms3 of the values of the quadratic means of the currents IA1, IA2, IA3. The same is true for the other second messages M2A, M2B, M2C.

Alternatively, when an outgoing line of the transformer is difficult to access, the calculating system 20 comprises N second modules that are all, with the exception of one second module, associated with one of the N outgoing lines, the last second module being associated with the output of the transformer. This calculating system makes it possible to determine the intensity, power or energy in the outgoing line that is difficult to access and that is not associated with a second module. In other operations, certain sums are then replaced by difference calculations.

The invention claimed is:

1. A calculating system for calculating an electric quantity relative to an electrical installation comprising a primary electrical conductor and several secondary electrical conductors electrically connected to the primary electrical conductor, the calculating system comprising:
   a first module implemented by circuitry and including a wireless transmitter;
   a plurality of second modules implemented by circuitry, each including a wireless transceiver and a current sensor configured to measure intensity of a current circulating in at least a corresponding conductor from among the primary and secondary electrical conductors; and
   a third module implemented by circuitry,
   wherein the first module includes a transmission device configured to periodically transmit a first time synchronization message to each second module at predetermined intervals,
   wherein each second module includes a first device configured to receive the first time synchronization message and a second device configured to transmit to the third module a second message at a period during the predetermined intervals at which the first time synchronization message is transmitted, each second module being configured to measure at least one intensity value using a corresponding current sensor upon reception of the first message, each second module being configured to transmit the corresponding second message to the third module in accordance with a predetermined time sequence of transmission of the second messages by the second modules, and each second module being configured to transmit the corresponding second message between two successive emission times of the first message, the second message containing the at least one intensity value measured by the corresponding current sensor upon reception of the first message, the intensity values being measured quasi-simultaneously by the various current sensors, with a synchronization margin of error smaller than 10 μs, and
   wherein the third module includes a wireless receiver, a second device configured to receive second messages, and a calculating device configured to calculate the electric quantity from intensity values measured quasi-simultaneously and received via said second messages.

2. The calculating system according to claim 1, wherein the calculating device is configured to calculate a sum of the intensity values received via the second messages.

3. The calculating system according to claim 1, wherein the first module further comprises a measuring device configured to measure the voltage circulating in a corresponding conductor from among the primary and secondary electrical conductors, and send the value of the measured voltage to the second modules via the first time synchronization message,
   wherein each second module comprises a calculating device configured to calculate an instantaneous power from the value of the voltage received via the first time synchronization message and the intensity value measured by the current sensor, and send the calculated electric power value to the third module via the second message, and
   wherein the calculating device of the third module is configured to calculate a sum of the received power values.

4. The calculating system according to claim 1, wherein the first module further comprises a measuring device configured to measure the voltage circulating in a corresponding conductor from among the primary and secondary electrical conductors, and send the value of the measured voltage to the second modules via the first time synchronization message,
   wherein each second module comprises a calculating device configured to calculate an electric energy from the value of the voltage received via the first time synchronization message and the intensity value measured by the current sensor, and send the calculated electric power value to the third module via the second message, and
   wherein the calculating device of the third module is configured to calculate a sum of the received energy values.

5. The calculating system according to claim 1, wherein each current sensor is configured to measure the intensity of the corresponding current and each second module comprises a sampling device configured to sample the measured intensity using a sampling frequency.

6. The calculating system according to claim 5, wherein the samples are acquired successively over several periods of said voltage, and according to increasing values of a sampling rank during a given period, the rank value being reset at the end of each period, and wherein the second modules comprise a first compression device for the intensity values measured by the corresponding current sensor, the compression device calculating the mean of the samples having a same rank value.

7. The calculating system according to claim 5, wherein the first time synchronization message contains the value of said sampling frequency, said value being a predetermined value or a multiple of the value of the frequency of the voltage of at least one conductor from among the primary and secondary electrical conductors.

8. The calculating system according to claim 7, wherein the samples are acquired successively over several periods of said voltage, and according to increasing values of a sampling rank during a given period, the rank value being reset at the end of each period, and wherein the second modules comprise a first compression device for the intensity values measured by the corresponding current sensor, the compression device calculating the mean of the samples having a same rank value.

9. The calculating system according to claim 1, wherein the second modules comprise a first compression device for calculating coefficients of the decomposition of said intensity value measured by the corresponding current sensor into a Fourier series.

10. The calculating system according to claim 1, wherein the first time synchronization message contains a reception request for the intensity values measured by the second modules.

11. A transformer substation for transforming an electrical current having a first alternating voltage into an electrical current having a second alternating voltage, the transformer substation comprising:
a first panel including at least one incoming electrical conductor connectable to an electric network;
a second panel including at least one primary outgoing electrical conductor and several secondary outgoing electrical conductors, each secondary outgoing conductor being electrically connected to a corresponding primary outgoing conductor;
an electric transformer connected between the first panel and the second panel and configured to transform the current with the first alternating voltage by the current having the second alternating voltage; and
a calculating system for calculating an electric quantity relative to the second panel, the calculating system including
a first module implemented by circuitry and including a wireless transmitter,
a plurality of second modules implemented by circuitry, each including a wireless transceiver and a current sensor configured to measure intensity of a current circulating in at least a corresponding conductor from among the primary and secondary electrical conductors, and
a third module implemented by circuitry,
wherein the first module includes a transmission device configured to periodically transmit a first time synchronization message to each second module at predetermined intervals,
wherein each second module includes a first device configured to receive the first time synchronization message and a second device configured to transmit to the third module a second message at a period during the predetermined intervals at which the first time synchronization message is transmitted, each second module being configured to measure at least one intensity value using a corresponding current sensor upon reception of the first message, each second module being configured to transmit the corresponding second message to the third module in accordance with a predetermined time sequence of transmission of the second messages by the second modules, and each second module being configured to transmit the corresponding second message between two successive emission times of the first message, the second message containing the at least one intensity value measured by the corresponding current sensor upon reception of the first message, the intensity values being measured quasi-simultaneously by the various current sensors, with a synchronization margin of error smaller than 10 µs, and
wherein the third module includes a wireless receiver, a second device configured to receive second messages, and a calculating device configured to calculate the electric quantity from intensity values measured quasi-simultaneously and received via said second messages.

12. A method for calculating an electric quantity relative to an electrical installation, the electrical installation comprising a primary electrical conductor and several secondary electrical conductors electrically connected to the primary electrical conductor, the method being implemented using a calculating system including:
a first module implemented by circuitry including a wireless transmitter, and
a plurality of second modules implemented by circuitry, each including a wireless transceiver and a current sensor configured to measure intensity of a current circulating in a corresponding conductor from among the primary and secondary electrical conductors,
the method comprising:
a) periodically transmitting at predetermined intervals, by the first module and to each second module, a first time synchronization message of the measurement of the intensity of the current circulating in the primary or secondary conductors;
b) receiving the first time synchronization message by each second module;
c) quasi-simultaneous measuring, with a synchronization margin of error smaller than 10 µs, the intensity of the current circulating in the corresponding primary or secondary conductors by each current sensor upon reception of the first message;
d) transmitting, by each second module and to a third module, a second message at a period during the predetermined intervals at which the first time synchronization message is transmitted, the transmitting, by each second module, includes transmitting the corresponding second message to the third module in accordance with a predetermined time sequence of transmission of the second messages by the second modules, and the second message being transmitted between two successive emission times of the first message, the second message containing at least one value of the intensity measured by the corresponding current sensor;
e) receiving the second messages by the third module; and
f) calculating the electric quantity from intensity values measured quasi-simultaneously and received via said second messages.

13. The method according to claim 12, wherein
during the measuring in step c), the measured intensity is sampled using a sampling frequency and the measured intensities are decomposed into a Fourier series, and
while during the calculating in step e), the electric quantity is calculated from values of the complex Fourier coefficients obtained in step c) up to a predetermined harmonic rank.

14. The method according to claim 12, wherein
during the measuring in step c), the measured intensity is sampled using a sampling frequency, the samples are successively acquired over several periods of the voltage of a corresponding conductor from among the primary and secondary electrical conductors, and according to increasing values of a sampling rank during a given period, the value of the rank being reset at the end of each period, and a mean of the samples having a same rank value is done, and
while during the calculating in step e), the electric quantity is calculated from mean values of the samples obtained in step c).

15. The method according to claim 12, wherein:
during step a), the voltage of a corresponding conductor from among the primary and secondary electrical conductors is measured, and the first time synchronization message comprises the value of that measured voltage, during step c), an electric power and/or an energy is calculated by the second module, from the value of the voltage measured during step a) and the intensity value measured by the current sensor, during step d), the second message further contains the value of the calculated electric power and/or energy, and during step e), a sum of the received power or energy values is further calculated by the third module.

16. The method according to claim 15, wherein during the measuring in step c), the measured intensity is sampled using a sampling frequency and the measured intensities are decomposed into a Fourier series, and while during the calculating in step e), the electric quantity is calculated from values of the complex Fourier coefficients obtained in step c) up to a predetermined harmonic rank.

17. The method according to claim 15, wherein during the measuring in step c), the measured intensity is sampled using a sampling frequency, the samples are successively acquired over several periods of the voltage of a corresponding conductor from among the primary and secondary electrical conductors, and according to increasing values of a sampling rank during a given period, the value of the rank being reset at the end of each period, and a mean of the samples having a same rank value is done, and while during the calculating in step e), the electric quantity is calculated from mean values of the samples obtained in step c).

18. The method according to claim 15, wherein during step a), the first time synchronization message further contains a reception request for the intensity and/or electric power and/or energy values measured or calculated by the second modules.

* * * * *